(12) United States Patent
Yang

(10) Patent No.: US 7,710,176 B2
(45) Date of Patent: May 4, 2010

(54) VOLTAGE DISTURBANCE AND HARMONICS MONITOR

(75) Inventor: Huaibin Yang, San Diego, CA (US)

(73) Assignee: IDEAL Industries, Inc., Sycamore, IL (US)

( * ) Notice: Subject to any disclaimer, the term of this patent is extended or adjusted under 35 U.S.C. 154(b) by 317 days.

(21) Appl. No.: 11/758,328

(22) Filed: Jun. 5, 2007

(65) Prior Publication Data

US 2008/0088999 A1 Apr. 17, 2008

Related U.S. Application Data

(60) Provisional application No. 60/803,946, filed on Jun. 5, 2006.

(51) Int. Cl.
*H03K 5/02* (2006.01)
(52) U.S. Cl. .......................... 327/178; 327/184; 363/77
(58) Field of Classification Search .................. None
See application file for complete search history.

(56) References Cited

U.S. PATENT DOCUMENTS 6,385,238 B1 * 5/2002 Nguyen .................. 375/232
7,129,713 B2 * 10/2006 Katz ...................... 324/664

OTHER PUBLICATIONS

PCT Search Report, Dec. 6, 2008, International Application No. PCT/US2007/070426.

* cited by examiner

*Primary Examiner*—An T Luu
(74) *Attorney, Agent, or Firm*—Cook Alex, Ltd.

(57) ABSTRACT

An electronic monitor for monitoring characteristics of an AC power line for swells, sags, RMS voltage, impulses, total harmonic distortion (THD) and frequency. The waveform is received at the monitor, scaled to a lower magnitude, rectified by an op amp with zero offset voltage, converted a digital form which is representative of the waveform and processed to determine the occurrence of any irregularity in the AC power waveform. Two DMA channels are used to store each cycle, or groups of cycles, of the waveform into two buffers for further processing. An input surge protective circuit limits impulse voltage to the power supply. Related methods are also disclosed.

27 Claims, 12 Drawing Sheets

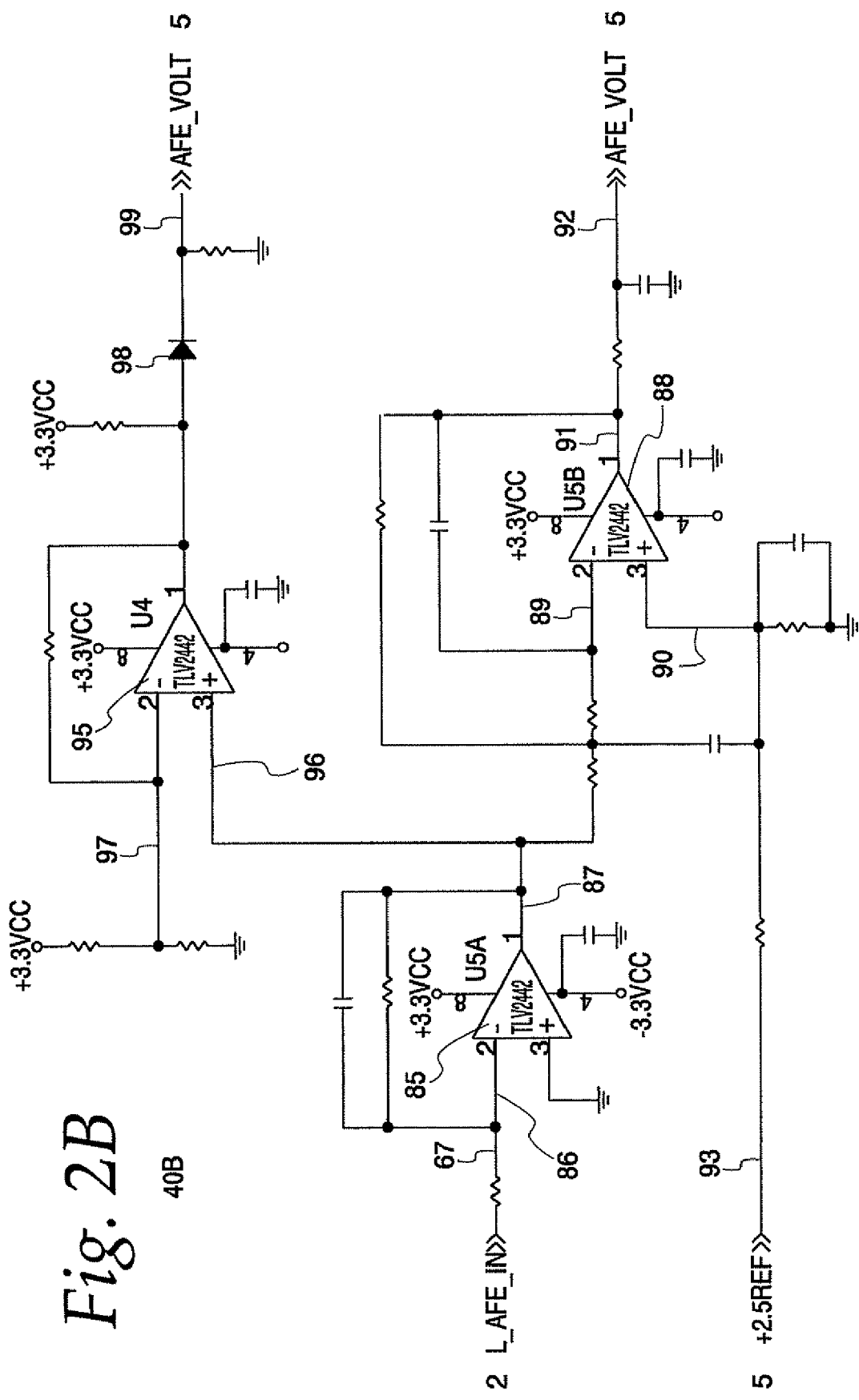

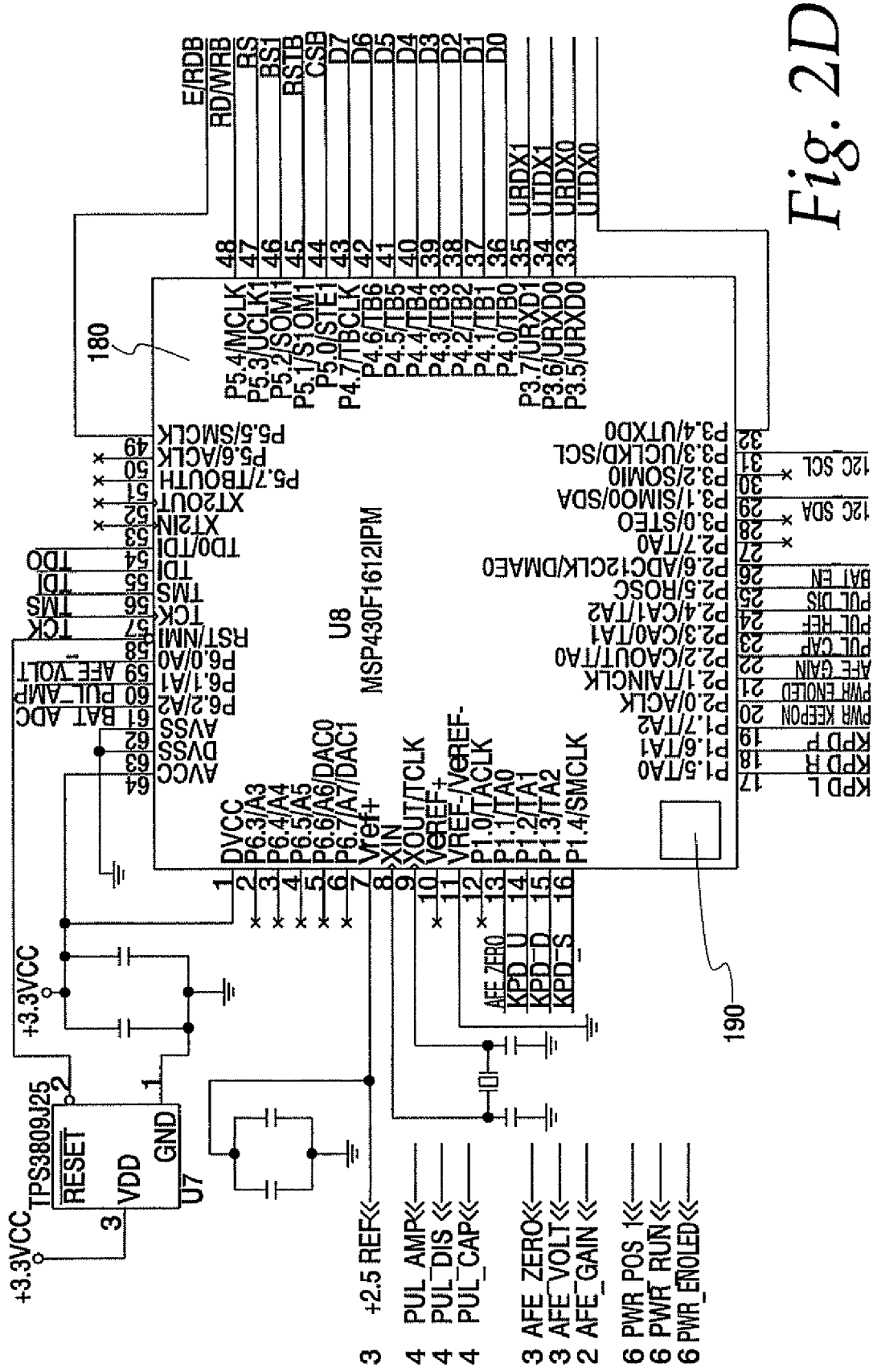
Fig. 2D1

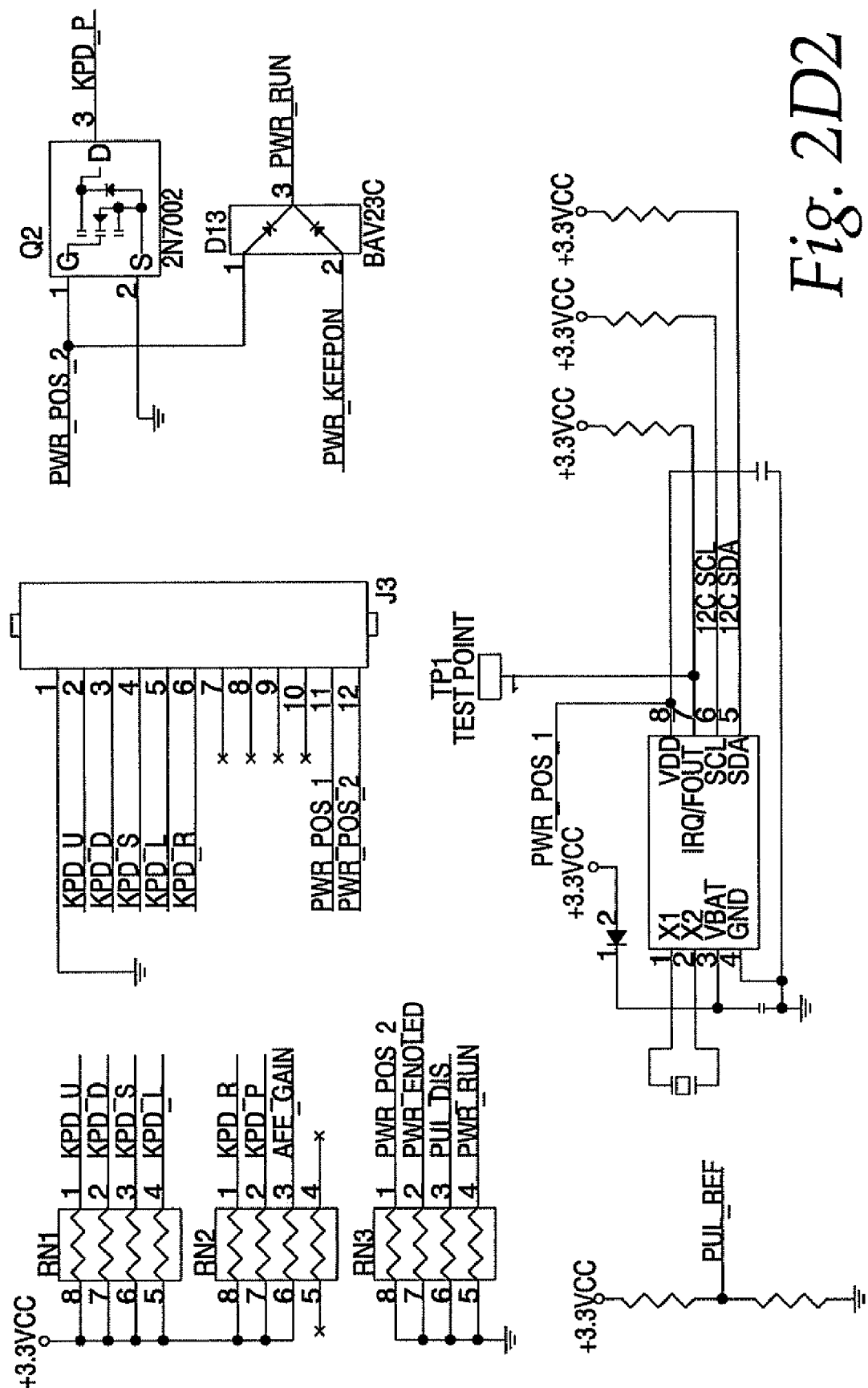
Fig. 2D2

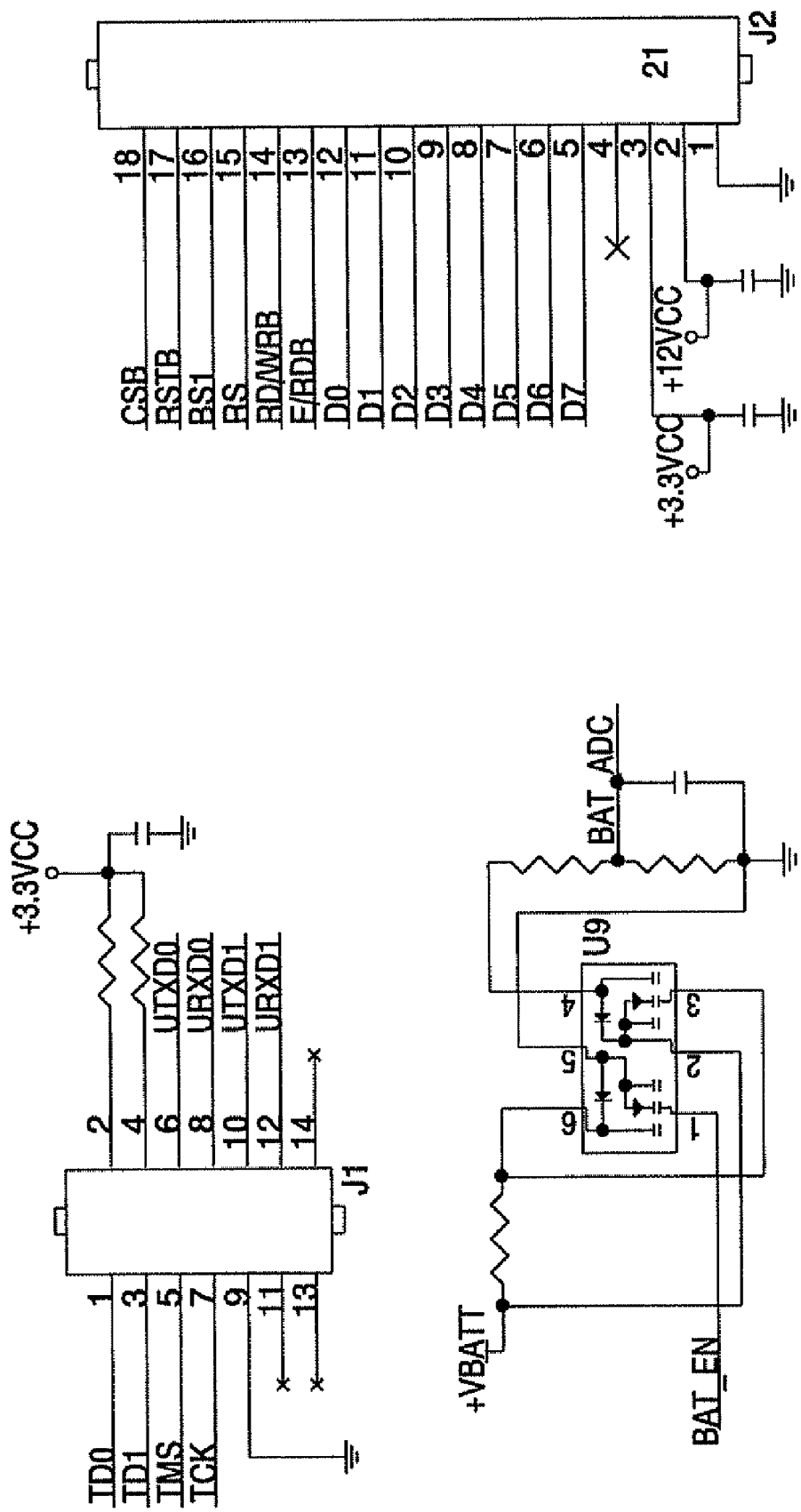
Fig. 2D3

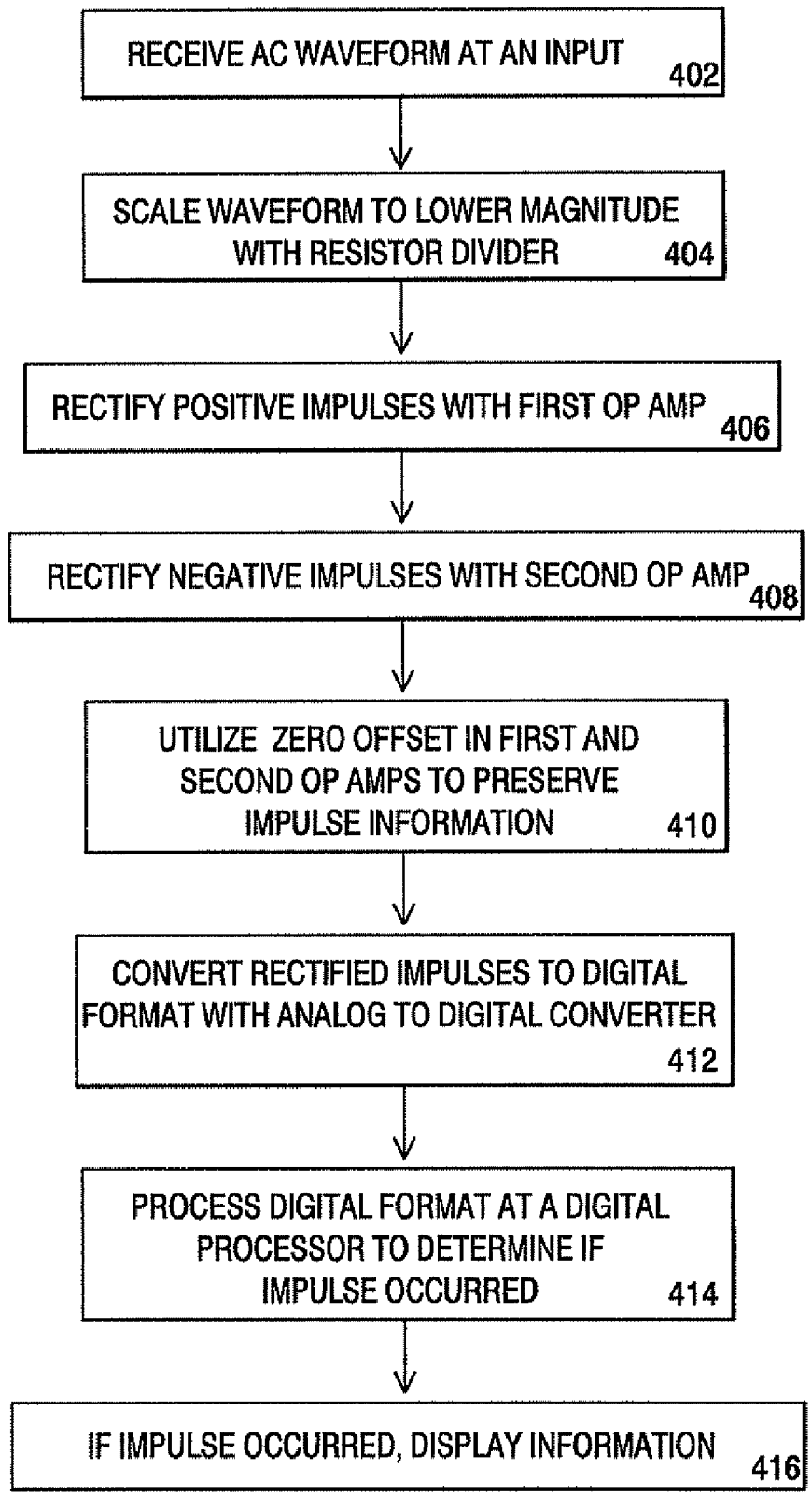

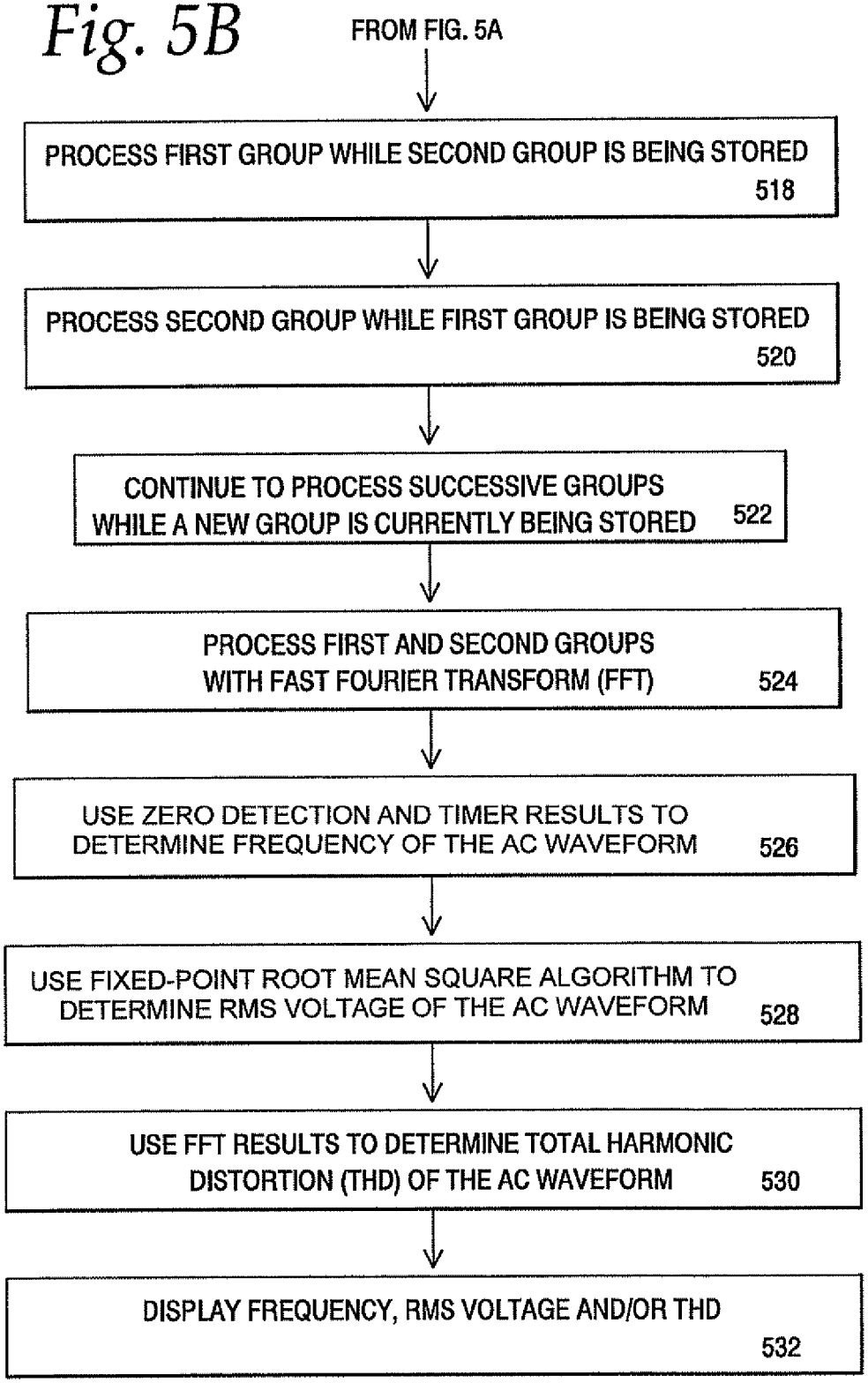

VOLTAGE DISTURBANCE AND HARMONICS MONITOR

CROSS-REFERENCE TO RELATED PATENT APPLICATION

This patent application is a non-provisional of prior provisional patent application Ser. No. 60/803,946, filed on Jun. 5, 2006, the right of priority of which is hereby claimed for this patent application.

FIELD OF THE INVENTION

The present invention relates generally to a voltage and harmonics monitor. More particularly, the present invention relates to surge protection, signal conditioning and storage of AC waveform data in a voltage and harmonics monitor.

BACKGROUND OF THE INVENTION

Voltage disturbances and harmonics cause premature equipment failures, automation failures, erratic computer operation, lost data and data errors, burned out motors, electronic module failure, premature lighting failure and the like. There is more equipment in homes, offices and industrial facilities that is sensitive to voltage disturbances and harmonics. For example, some types of equipment that are affected by poor power quality include electronic lighting ballasts, computers, copiers, laser printers, adjustable speed drives, industrial programmable logic controllers (PLCs), medical equipment and many microprocessor-controlled devices. Some equipment also contributes to poor power quality. Poor power quality may also reduce the useful life of many types of equipment.

Thus, stable power is needed for the complex electrical installations typically encountered in today's buildings. Of course, voltage surges can be caused by lightning. However, the cause of poor power quality frequently resides in the building rather than in the electrical power distribution system outside of the building. Thus, monitoring of the power quality inside of the building, such as on selected electrical circuits, may assist in diagnosing where any problems occur. Insurance studies indicate that about one-half of the cost associated with electrical failures could be prevented by regular maintenance.

A voltage disturbance and harmonics monitor can verify and diagnose voltage sags, swells, impulses and total harmonic distortion (THD) to assist in the monitoring of power quality. Sags and swells are temporary increases or decreases in voltage that can affect the performance of equipment. Sources of such voltage events include motors, photocopiers, arcing switches, water coolers, air conditioners and some routine utility operations.

Harmonic distortion is an increasing problem due to the increase of electronic loads. A harmonic is an integer multiple of the fundamental 60 Hz waveform. Electronic loads typically convert AC voltage to DC voltage for supplying power to lower voltage electronic circuitry. This process distorts the AC voltage waveform and contributes to the "flat-topping" of the AC supply voltage, which starves other power supplies of the optimal peak voltage needed to power their loads. The more devices that are present, the greater the likelihood of this type of voltage distortion and the greater the likelihood of adverse effects on other equipment. Harmonics can also be caused by loads switching on and off, electronic ballasts in fluorescent lighting, variable speed motor drives, soft start motors, welding equipment and the like. Harmonics also affect traditional loads and wiring as well, in the form of added heat, nuisance tripping of peak detecting circuit breakers and noise on communication equipment. In general, a THD above about five percent should be investigated and mitigated where feasible.

There has therefore a need for an improved voltage disturbance and harmonic monitor for monitoring the quality of the electrical power.

A general object of the present invention is to therefore provide an improved voltage disturbance and harmonic monitor for monitoring the quality of the electrical power.

Another object of the present invention is to provide an improved voltage disturbance and harmonic monitor which is capable of monitoring power quality for all power systems throughout the world.

A further object of the present invention is to provide a voltage disturbance and harmonic monitor which includes improved surge protection for high voltage surges in the power system.

Yet another object of the present invention is to provide a voltage disturbance and harmonic monitor with low-distortion signal conditioning.

A still further object of the present invention is to provide a voltage disturbance and harmonic monitor with improved storage of sample data collected during the monitoring of power quality.

Another object of the present invention is to provide a voltage disturbance and harmonic monitor with double buffering of sample data acquired during the monitoring of power quality.

Yet another object of the present invention is to provide a voltage disturbance and harmonic monitor which utilizes direct memory access (DMA) techniques to alternately store sample data acquired during the monitoring of power quality in dual buffers.

SUMMARY OF THE INVENTION

The present invention is directed to a method of processing information about the waveform in an electronic monitor for monitoring an AC power waveform to detect any impulses on the waveform. The method includes the steps of receiving the waveform at the monitor, scaling the waveform including any impulses to a lower magnitude, rectifying any positive impulses on the waveform with a first operational amplifier having a diode in a feedback loop of the first operational amplifier, and rectifying any negative impulses on the waveform with a second operational amplifier having a diode in a feedback loop of the second operational amplifier. The first and second operational amplifiers rectify the positive and negative impulses with approximately zero offset voltage.

Additional steps of the method include converting the rectified positive and negative impulses to a digital form which is representative of the positive and negative impulses, processing the digital representations of the positive and negative impulses to determine the occurrence of an impulse on the AC power waveform, and displaying the occurrence of an impulse on the AC power waveform on a display of the monitor. The step of scaling the waveform including any impulses may be accomplished with a resistor divider.

The present invention is further directed to an electronic monitor for monitoring an AC power waveform to detect any impulses on the waveform. The monitor preferably includes an input line for receiving the waveform at the monitor, means for scaling the waveform including any impulses to a lower magnitude, a first operational amplifier having a diode in a feedback loop of the first operational amplifier to rectify any positive impulses on the waveform, and a second operational amplifier having a diode in a feedback loop of the second operational amplifier to rectify any negative impulses on the waveform. The first and second operational amplifiers rectify the positive and negative impulses with approximately zero offset voltage.

The electronic monitor preferably further includes an analog to digital converter to convert the rectified positive and negative impulses to a digital form which is representative of the positive and negative impulses, a digital processor to process the digital representations of the positive and negative impulses to determine the occurrence of an impulse on the AC power waveform, and a display for displaying the occurrence of an impulse on the AC power waveform on a display of the monitor. The means for scaling the waveform including any impulses may be a resistor divider.

The present invention is also directed to methods of monitoring an AC power waveform, including the steps of receiving the waveform at the monitor, converting the waveform into digital data representative of the waveform; determining the zero crossing of successive cycles of the AC waveform, grouping a predetermined number of cycles of the AC waveform into a first group and a second group, using a first direct memory access channel of a digital processor to store the digital representation of a first group of cycles in a first buffer, and using a second direct memory access channel of the digital processor to store the digital representation of a second group of cycles in a second buffer.

The methods may further include processing the first group of cycles with the digital processor while the second group of cycles is being stored in the second buffer to determine the frequency of the AC waveform, the root mean square of the voltage of the AC waveform and/or the total harmonic distortion of the AC waveform. The first and second groups of cycles may each constitute four cycles.

The present invention is further directed to electronic monitor for monitoring an AC power waveform, including an input line for receiving the waveform at the monitor, an analog to digital converter for converting the waveform into digital data representative of the waveform, a zero crossing detector for determining the zero crossing of successive cycles of the AC waveform, a digital processor for grouping a predetermined number of cycles of the AC waveform into a first group and a second group, a first direct memory access channel of the digital processor for storing the digital representation of a first group of cycles in a first buffer, and a second direct memory access channel of the digital processor for storing the digital representation of a second group of cycles in a second buffer.

Preferably, the digital processor processes the first group of cycles with the digital processor while the second group of cycles is being stored in the second buffer. The processing of the first group of cycles may determine the frequency of the AC waveform, the root mean square of the voltage of the AC waveform, and/or the total harmonic distortion of the AC waveform. The first and second groups each constitute four cycles.

Further methods in accordance with the present invention for monitoring an AC power waveform include the steps of receiving the waveform at the monitor, converting the waveform into digital data representative of the waveform, determining the zero crossing of successive cycles of the AC waveform, grouping a predetermined number of cycles of the AC waveform into a first group and a second group, using a first direct memory access channel of a digital processor to store the digital representation of a first cycle of the first group of cycles in a first memory location in a first buffer, and using a second direct memory access channel of the digital processor to store the digital representation of a second cycle of the first group of cycles in a second memory location of the first buffer.

Additional method steps include continuing to alternate use the first and second direct memory access channels to store successive cycles of the first group of cycles in successive memory locations of the first buffer until all cycles of the first group of cycles are stored in the first buffer, using a first direct memory access channel of a digital processor to store the digital representation of a first cycle of the second group of cycles in a first memory location in a second buffer, using a second direct memory access channel of the digital processor to store the digital representation of a second cycle of the second group of cycles in a second memory location of the second buffer, continuing to alternate use the first and second direct memory access channels to store successive cycles of the second group of cycles in successive memory locations of the second buffer until all cycles of the second group of cycles are stored in the second buffer. The first and second groups may each constitute four cycles.

The present invention further contemplates a surge current limiting input circuit for a power supply includes at least one surge current limiting resistor in series between a source of AC power and an impulse protective device, the impulse protective device coupled to ground to attenuate some impulse energy from the source of AC power, a second surge current limiting resistor connected in series with a rectifying diode between the impulse protective device and an input to the power supply, and a capacitor coupled from the input of the power supply to ground. The at least one surge current limiting resistor may include a plurality of surge current limiting resistors. The capacitor may be selected with a lower voltage rating. The at least one surge current limiting resistor and the second surge current limiting resistor limit the surge currents associated with any impulses from the source of AC power.

BRIEF DESCRIPTION OF THE DRAWINGS

The invention, together with its objects and the advantages thereof, may best be understood by reference to the following description taken in conjunction with the accompanying drawings, in which like reference numerals identify like elements in the figures, and in which:

FIGS. 2A-2C and 2D1-2D3 collectively constitute a schematic diagram of electronic circuitry utilized in the voltage disturbance and harmonic monitor of FIG. 1 in accordance with the present invention;

FIG. 4 is a flow chart illustrating representative steps of methods utilized by the present invention for determining if an impulse occurred on the AC waveform; and FIGS. 5A-5B together constitute a flow chart illustrating representative steps of methods utilized by the present invention for determining the frequency, RMS voltage and total harmonic distortion of the AC waveform.

DESCRIPTION OF THE PREFERRED EMBODIMENTS

It will be understood that the present invention may be embodied in other specific forms without departing from the spirit thereof. The present examples and embodiments, therefore, are to be considered in all respects as illustrative and not restrictive, and the invention is not to be limited to the details presented herein.

Figure 1:
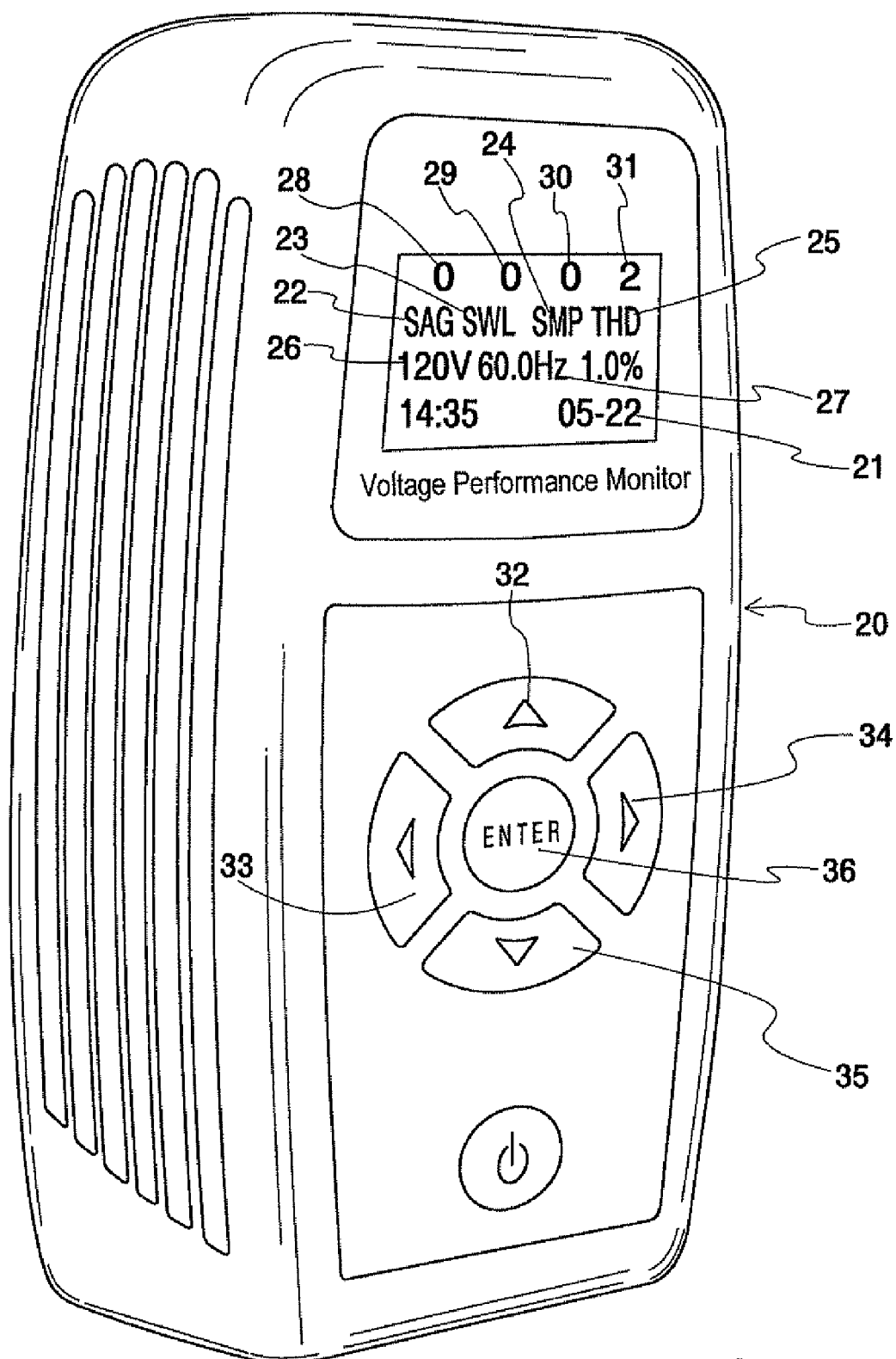
FIG. 1 is a perspective view of a voltage disturbance and harmonic monitor which incorporates the improvements of the present invention.

A voltage disturbance and harmonic monitor, generally designated 20, and which is designed and constructed in accordance with the present invention, is shown in FIG. 1. The monitor 20 has a display 21 for displaying conditions or events relating to its monitoring of an electrical circuit. For example, in FIG. 1, display 21 may display conditions or events relating to sag 22, swell (SWL) 23, impulses (IMP) 24, total harmonic distortion (THD) 25, line voltage 26 and/or line frequency 27. In addition, display 21 may indicate the number of times that certain characteristics, such as sag 23, swell 24 and THD 26 are out of specification, or if an impulse 25 event has occurred. The occurrence of any of these events is indicated at fields 28, 29, 31 and 30, respectively, in the display 21. In the example shown in FIG. 1, THD 25 has been out of specification two times during the last monitoring interval as shown at field 31. On the other hand, sag 23 and swell 24 have not been out of specification, and no impulses 25 have occurred as indicated by the zeros in fields 28, 29 and 30.

Navigation keys 32, 33, 34 and 35 permit a user to access and scroll through the various screens besides the screen displayed in FIG. 1. For example, a user may scroll one of the characteristics displayed in FIG. 1 and press the enter button 36 for more information on the selected characteristic.

Figure 2A:
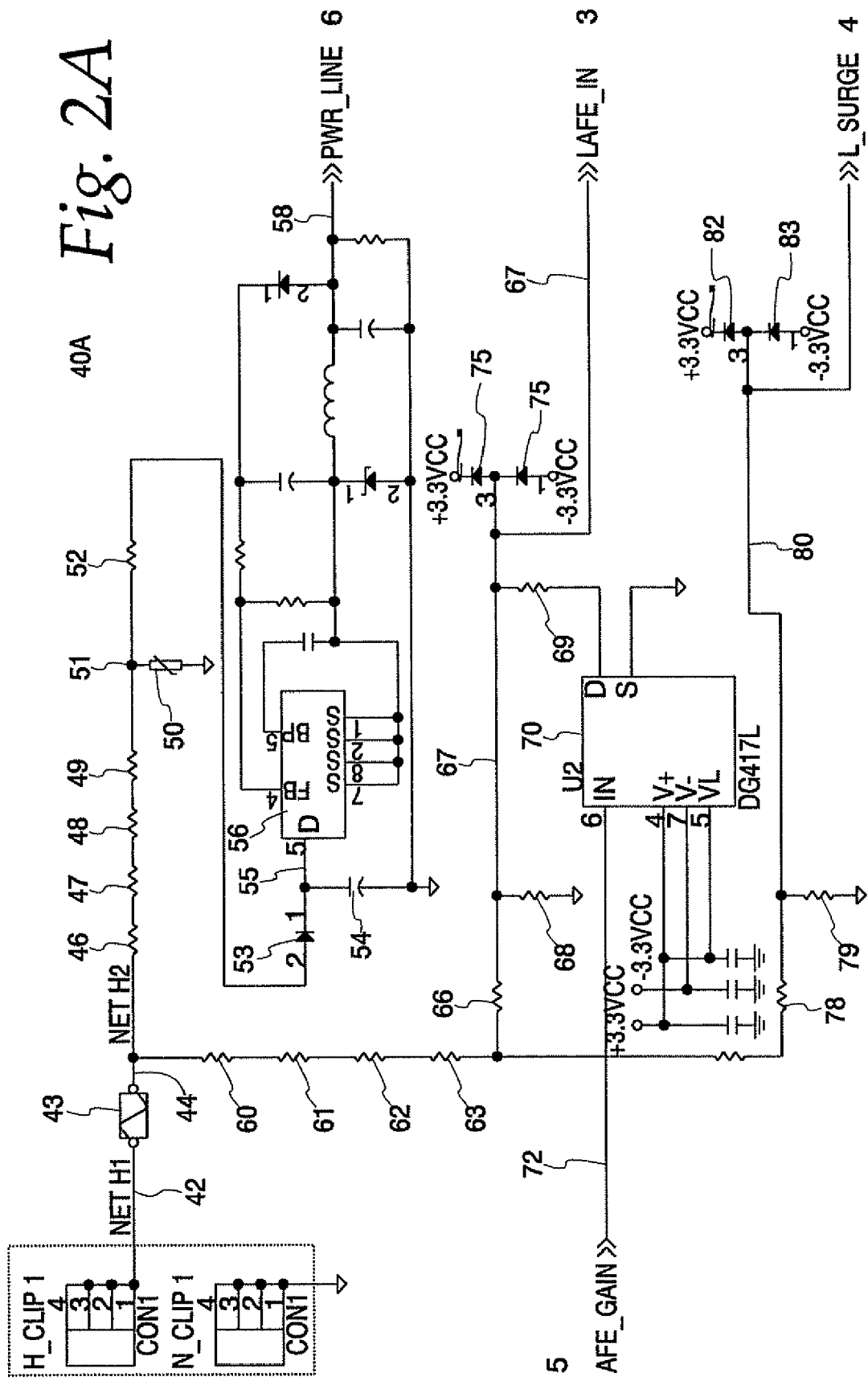
Figure 2C:
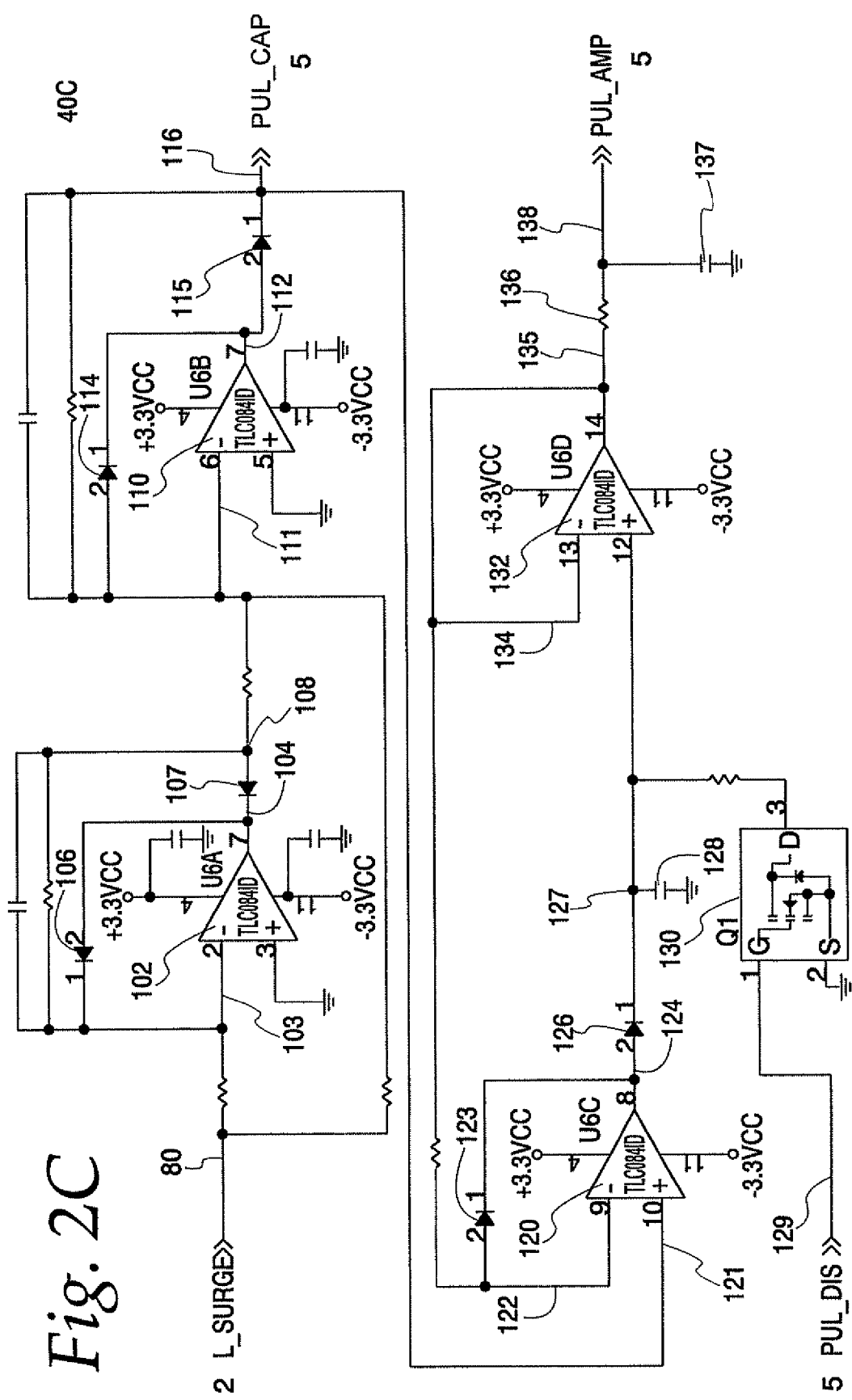

FIGS. 2A-2C and 2D1-2D3 collectively constitute a schematic diagram 40 for monitor 20. That portion of schematic diagram 40 shown in FIG. 2A is designated 40A, that portion of schematic diagram 40 shown in FIG. 2B is designated 40B, that portion of schematic diagram 40 shown in FIG. 2C is designated 40D, and that portion of schematic diagram 40 shown in FIGS. 2D1-2D3 is designated 40D. With reference to FIG. 2A, an input AC voltage line 42 that is being monitored by monitor 20 is protected by a fuse 43. An input line 44 on the other side of fuse 43 provides current to a power supply, including a linear voltage regulator 56 for supplying DC operating power to the various electronic components in the schematic diagram 40 from power output line 58, which may be about 3.3 VDC. Before the input 55 of voltage regulator 56 are a plurality of surge current limiting resistors 46-49 connected in series between the input AC line 44 and node 51. Connected at node 51 to ground is a varistor 50 to clip input transient voltages. For example, varistor 50 may be selected to clip AC voltages that exceed 275 VAC. Another surge current limiting resistor 52 is in series with a diode 53 between node 50 and input terminal 55 of the voltage regulator 56. Resistors 46-49 and 51 are preferably surge current limiting resistors which can assist in absorbing the energy of any voltage transients or impulses on input AC line 44. Diode 53 half-wave rectifies the input AC voltage to provide an unregulated DC voltage at input terminal 55. A capacitor 54 is connected at input terminal 55 to ground and it stores energy for those portions of the AC cycle when diode 53 is reverse biased and non-conducting.

While varistor 50 clips most of the energy of voltage transients or impulses, some of the peak magnitudes of fast rising impulses is not clipped due to the response time and other characteristics of varistors. For example, if a lightning strike occurs near a line that monitor 40 is monitoring, a spike on the order of 700 volts may appear on AC input line. Such a spike will not be entirely attenuated by varistor 50, such as impulses that have fast rise times, and some of the spike energy will therefore be present at node 51. Energy absorbing resistor 52 thus assists in reducing the transient voltage fed through diode 53 to capacitor 54 and to the input terminal 55 of the voltage regulator 56. At the same time, energy absorbing resistors 46-49 also assist in reducing the transient voltage at input terminal 55. Since resistors 46-49 and 52 reduce the impulse or transient voltage that appears at terminal 55 and across capacitor 54, the maximum operating voltage of capacitor 54 may be lower. For example, electrolytic capacitors suitable for power supply use with a maximum voltage rating above 500 volts are fairly expensive. With energy absorbing resistors 46-49 and 52, the voltage rating of capacitor 54 may be selected below 500 volts, such as about 400 volts. Resistors 46-49 and 52 may each be about 100 ohms.

A portion 40A of the circuitry 40 illustrated in FIG. 2A is used to provide a reduced AC voltage suitable for monitoring by lower voltage electronics, such as for sag, swell and harmonic content. To this end, a resistor divider formed by the series connected resistors 60-63 and 66 and resistor 68 provide a reduced AC voltage signal on line 67 that is representative of the AC voltage on input AC line 44. For example, if resistors 60-63 and 66 are each selected to be about 68K ohms and resistor 68 is selected to be about 4.3K ohms, line 67 will have a voltage of about 1.5 VAC when input AC line 44 is 120 VAC.

However, it is desirable that monitor 20 be capable of monitoring line voltages throughout the world, which entails a voltage range of about 85 VAC to about 220 VAC. To accommodate the higher end of this range, an analog switch 70, which is normally open, can be closed by a signal on line 72 to place resistor 69 in parallel with resistor 68. For example, if resistors 68 and 69 are both about 4.3K ohms, the signal on line 67 can be reduced by about one-half when switch 70 closes and places resistor 69 in conduction. Thus, if the AC input line is about 220 VAC, the signal on line 67 will be about 1.4 VAC. Analog switch 70 is commercially available as part number DG417 from Dallas Semiconductor. Input line 72 of switch 70 may be controlled by a microprocessor 180 shown in FIG. 2D1, and which is further described below. A pair of diodes 74 and 75 is poled and biased to +3.3 VDC and to −3.3 VDC to limit the signal on line 67 to about ±4 VDC to protect the electronics which monitors line 67.

Input AC line 44 is also routed through resistors 60-63 and 78 to a line 80 which is monitored by monitor 20 for any impulses or other transients. Resistors 60-63 and 78, in combination with resistor 79, form another voltage divider which represents a divided portion of any impulse that appears on the input AC line 44. For example, if resistors 60-63 and resistor 78 are about 68K ohms and resistor 79 is about 270 ohms, it can be shown that a several hundred volt impulse appearing on AC line 44 will be translated into an impulse of slightly less than a volt on line 80. Diodes 82 and 83 limit the voltage which may appear on line 80 in a similar manner as the previously described diodes 74 and 75 on line 67.

The circuitry 40B shown in FIG. 2B provides signal conditioning for the voltage signals on line 67 of FIG. 2A. A first operational amplifier 85 receives the representation of the input AC voltage on line 67 at its inverting input 86. Preferably, op amp 85 has its feedback loop set for about unity gain. The output of op amp 85 is fed to the inverting input 89 of another op amp 88, which is also preferably set for about unity gain. The non-inverting input 90 of op amp 88 is connected to a voltage reference, such as about +2.5 VDC, to level shift the output 92 of op amp 88 by the amount of the voltage reference. This assures that the negative portions of the AC voltage signal on line 67 will be shifted to a positive voltage level to be compatible with the voltage level constraints of an input terminal of a microprocessor, such as microprocessor 180 in FIG. 2D1.

Another op amp or comparator 95 operates as a zero crossing detector to determine when the AC waveform crosses from positive to negative. Comparator 95 has its non-inverting input referenced to a very low positive bias such as about +15 mV. The inverting input 96 is connected to the output 87 of op amp 85. Thus, while the representation of the AC waveform is positive, the output 94 of comparator 95 is negative, diode 98 is reverse biased and non-conducting and zero crossing output line 99 is at a logic 0. However, as the AC waveform crosses zero volts and turns negative, the output 94 of comparator 95 goes positive, diode 98 becomes forward biased and conducting, and zero crossing output line 99 rises to a logic 1. Thus, microprocessor 180 will know that a zero crossing of the AC waveform has occurred when zero crossing output line 99 becomes a logic 1.

The circuitry 40C shown in FIG. 2C provides signal conditioning for the impulse and transient signals on line 80 of FIG. 2A. It will be appreciated that line 80 may have both positive and negative impulses. It is desirable to preserve and monitor both polarities of impulses. Line 80 from FIG. 2A is coupled to the inverting input 103 of a first op amp 102. Op amp 102 has a diode 106 in its feedback loop between output 104 and inverting input 103. Another diode 107 is disposed in the output line 104. The feedback loop of op amp 102 is set for about unity gain. It will be appreciated that, with diodes 106 and 107 poled as shown in FIG. 2C, that op amp 102 will rectify positive impulses on line 80, and negative impulses on line 80 will be blocked. Thus, a positive impulse on line 80 will appear as a negative impulse at node 108.

Line 80 from FIG. 2A is also coupled to the inverting input 111 of a second op amp 110. Op amp 110 also has a diode 114 in its feedback loop between output 112 and inverting input 111. Another diode 115 is disposed in the output line 116. The feedback loop of op amp 110 is set for about unity gain. It will be appreciated that, with diodes 114 and 115 poled as shown in FIG. 2C, that op amp 110 will rectify negative impulses on line 80, and positive impulses on line 80 will be blocked. Op amp 110 will also rectify any negative impulses from op amp 102 at node 108, which is also coupled to the inverting input 111 of op amp 110. Thus, negative impulses from line 80, and negative impulses from op amp 102, will appear as positive impulses on output line 116.

It will be further appreciated that op amps 102 and 110 rectify the impulses appearing on line 80 with virtually no offset. For example, if the operational amplifier circuits, including op amps 102 and 110 were replaced by diodes, much of the impulse information on line 80 would be lost due to the typical forward bias voltage of silicon diodes of about 0.7 volts. That is, diodes would clip or lose the impulse information which is between ±0.7 volts. Since resistors 60-65 and 78-79 divide any impulse appearing on input AC line 44 on line 80 to a small portion of the actual impulse, information concerning smaller impulses could be completely lost by using rectifying diodes only. In this sense, the operational amplifier circuits in FIG. 40C may be thought of as "super diodes" since they act as diodes without any forward bias offset.

Op amps 120 and 132 in FIG. 2C form a peak detector which will capture the peak magnitude of impulses on line 80. The output of op amp 110 on line 116 is received at the non-inverting input of op amp 120. The signal PUL_CAP on line 116 is used by microprocessor 180 to determine the duration of any detected impulses. A diode 123 is connected in the feedback loop of op amp 120 from its output 124 to its inverting input 122. Thus, op amp 120 will effectively rectify any positive pulses appearing on line 116. Another diode 126 disposed between output 124 of op amp 120 and a capacitor 128 will then peak charge capacitor 128 with the peak magnitude of any pulses processed by op amp 120.

Another op amp 132 is configured as a voltage follower with its inverting input 134 connected to its output 135. Op amp 132 therefore provides the voltage across capacitor 128 at its output 135. Resistor 136 and capacitor 137 provide high frequency filtering of the output 135 on peak detector output line 138. Microprocessor 180 can reset the peak magnitude or disable the peak detector by controlling line 129 to an electronic switch 130. Electronic switch 130 can then discharge capacitor 128 to ground.

Figure 3A:
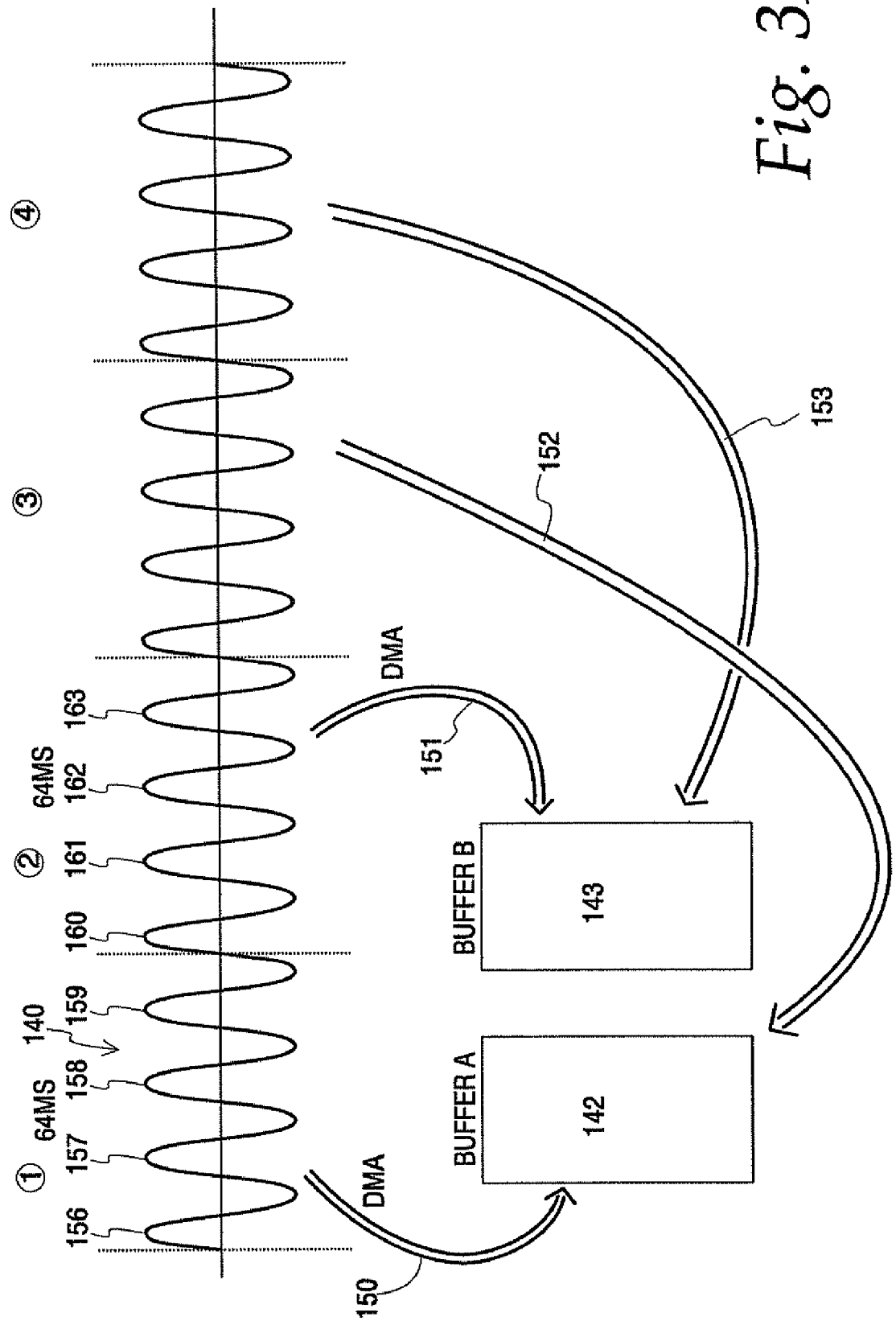
FIGS. 3A-3B are diagrams illustrating the use of dual buffers for storing sample AC waveform data acquired by the voltage disturbance and harmonic monitor of FIG. 1
Figure 3B:
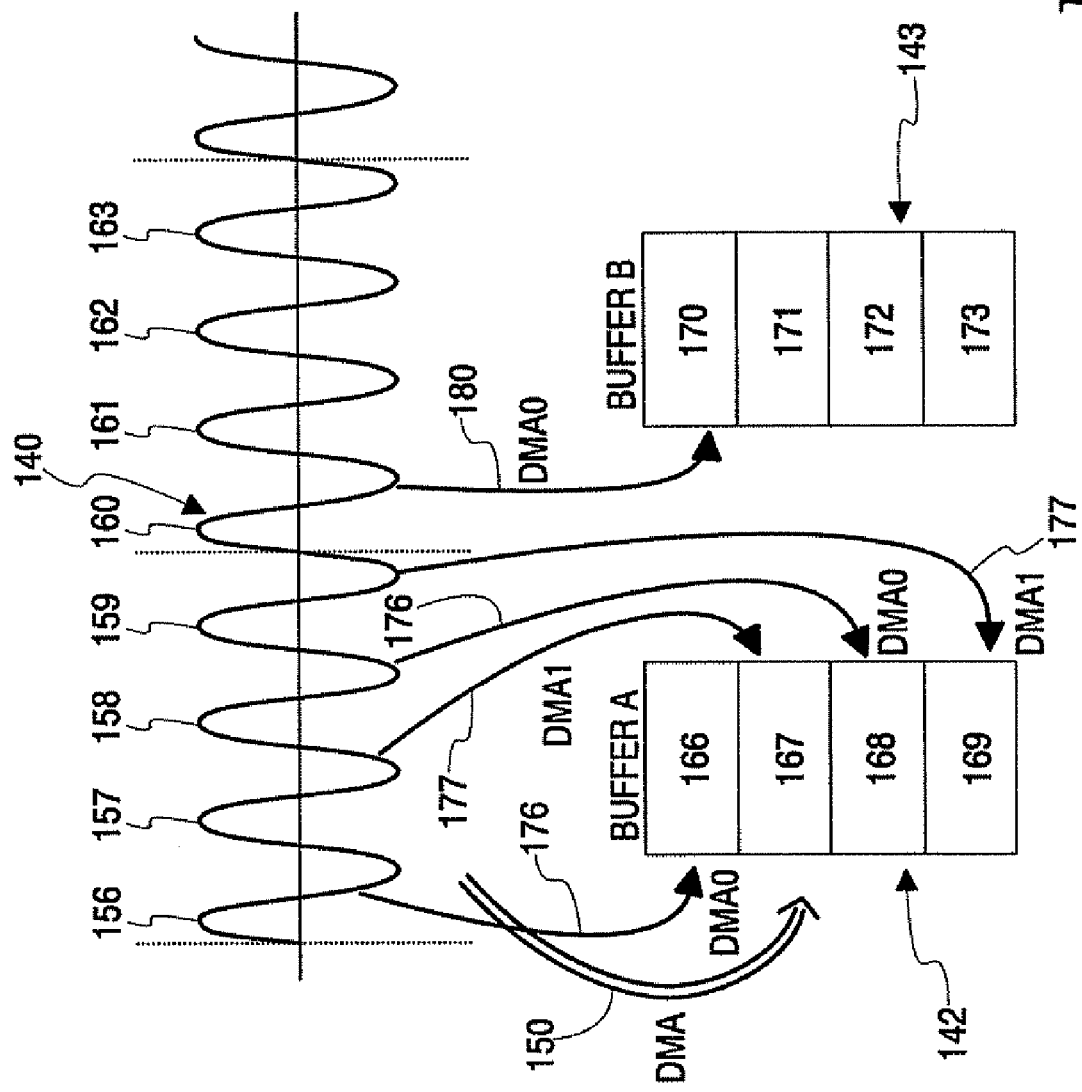

FIGS. 2D1-2D3 illustrate a portion 40D of the circuitry 40, including a microprocessor 180 and its associated circuitry. Preferably, microprocessor 180 has an analog to digital converter 190 for receiving analog input impulse signals from op amp 110 in FIG. 2C and for receiving the analog waveform signals from op amp 88 in FIG. 2B. Such a microprocessor is commercially available from Texas Instruments as part number MSP430F1612. This microprocessor also has direct memory access (DMA) channels 150 and 151, which will be utilized and further described below with reference to FIGS. 3A-3B. While the present invention contemplates the use of a microprocessor, any other suitable digital processor may also be utilized.

FIG. 3A illustrates methods in accordance with the present invention for storing data representative of groups of cycles of the monitored AC waveform 140 into dual buffers 142 and 143 by utilizing the DMA capabilities of microprocessor 180 of FIG. 2D1. A zero crossing detector determines the start and end of each cycle of the AC waveform. In the example of FIG. 3A, each cycle of a 60 Hz waveform represents about 16 milliseconds (ms) in time. Thus, each successive group of four cycles is about 64 ms. When the first group of four cycles 144 of waveform information is received, the first group 144 may be stored via a first DMA cycle 150 in a first buffer 142. When the second group of four cycles 145 of waveform information is received, the second group 145 may be stored via a second DMA cycle 151 in a second buffer 143. Likewise, when the third group of four cycles 146 of waveform information is received, the third group 146 may be stored via a third DMA cycle 152 in the first buffer 142. Lastly, when the fourth group of four cycles 147 of waveform information is received, the fourth group 147 may be stored via a fourth DMA cycle 153 in the second buffer 143. Thus, the groups of four cycles 144-147 of waveform information are alternately stored in first buffer 142 and in second buffer 143. Since it takes about 64 ms to accumulate the waveform information concerning each group of four cycles, microprocessor 180 can be processing the prior group of four cycles while the next group of four cycles is being accumulated for storage in one of buffers 142 or 143. For example, microprocessor 180 may conduct fast Fourier transforms (FFTs) on matched cycles of waveform information to determine certain characteristics of the waveform, such as the total harmonic distortion present in waveform 140. Zero detection and timer results may be used to determine the frequency of waveform 140. Similarly, a fixed-point square root algorithm may be used to determine the RMS voltage of the AC waveform 140.

FIG. 3B illustrates a further refinement of the methods shown in FIG. 3A. In FIG. 3B, each successive cycle of waveform 140 is stored in a separate location in the first buffer 142 or in the second buffer 143. Thus, DMA cycle 150 consists of separate DMA cycles in which the microprocessor's DMA channels DMA0 176 and DMA1 177 alternate in placing each waveform cycle, such as cycles 166-169, in a separate location in the first buffer 142. Thus, each successive cycle of waveform information from waveform 140 is alternately stored in buffer 142 until four cycles 166-169 have been stored in buffer 142. The process then alternates to place the next four successive cycles, such as cycles 170-173, of waveform information in the second buffer 143. Since it takes about 16 ms to accumulate the waveform information for each cycle, microprocessor 180 can be processing the prior cycle while the next cycle is being accumulated for storage in one of buffers 142 or 143. As with the example in FIG. 3A, microprocessor 180 may conduct fast Fourier transforms (FFTs) on matched cycles of waveform information in FIG. 3B to determine the characteristics of the waveform, such as the total harmonic distortion of waveform 140. As previously mentioned, zero detection and timer results may be used to determine the frequency of waveform 140 and a fixed-point square root algorithm may be used to determine the RMS voltage of the AC waveform 140.

FIG. 4 is a flow chart illustrating representative steps of methods utilized by the present invention for determining if an impulse occurred on the AC waveform. In view of the above description of the circuitry 40 shown in FIGS. 2A-2D3 and the use of the direct memory access to process successive cycles of the AC waveform 140, it will be appreciated that the present invention is also directed to methods of processing information about the waveform in an electronic monitor for monitoring an AC power waveform. For example, an exemplary method of detecting any impulses on the waveform 140 is shown in flow chart 400 in FIG. 4. The method begins with receiving the waveform 140 at the monitor 20 in block 404, and scaling the waveform, including any impulses, to a lower magnitude such as with a resistor divider at block 404. Any positive impulses on the waveform may then be rectified at block 406, such as with a first operational amplifier having a diode in its feedback loop at block 406. Similarly, any negative impulses on the waveform may be rectified, such as with a second operational amplifier having a diode in its feedback loop at block 408. Preferably, the first and second operational amplifiers rectify the positive and negative impulses with approximately zero offset voltage, as shown in block 410.

Additional steps of the method include converting the rectified positive and negative impulses to a digital form which is representative of the positive and negative impulses, such as with an analog to digital converter in block 412. The digital representations of the positive and negative impulses may then be processed to determine the occurrence of an impulse on the AC power waveform at block 414. If an impulse has occurred, the occurrence of an impulse on the AC power waveform may be displayed on a display of the monitor, at block 416.

Figure 5A:
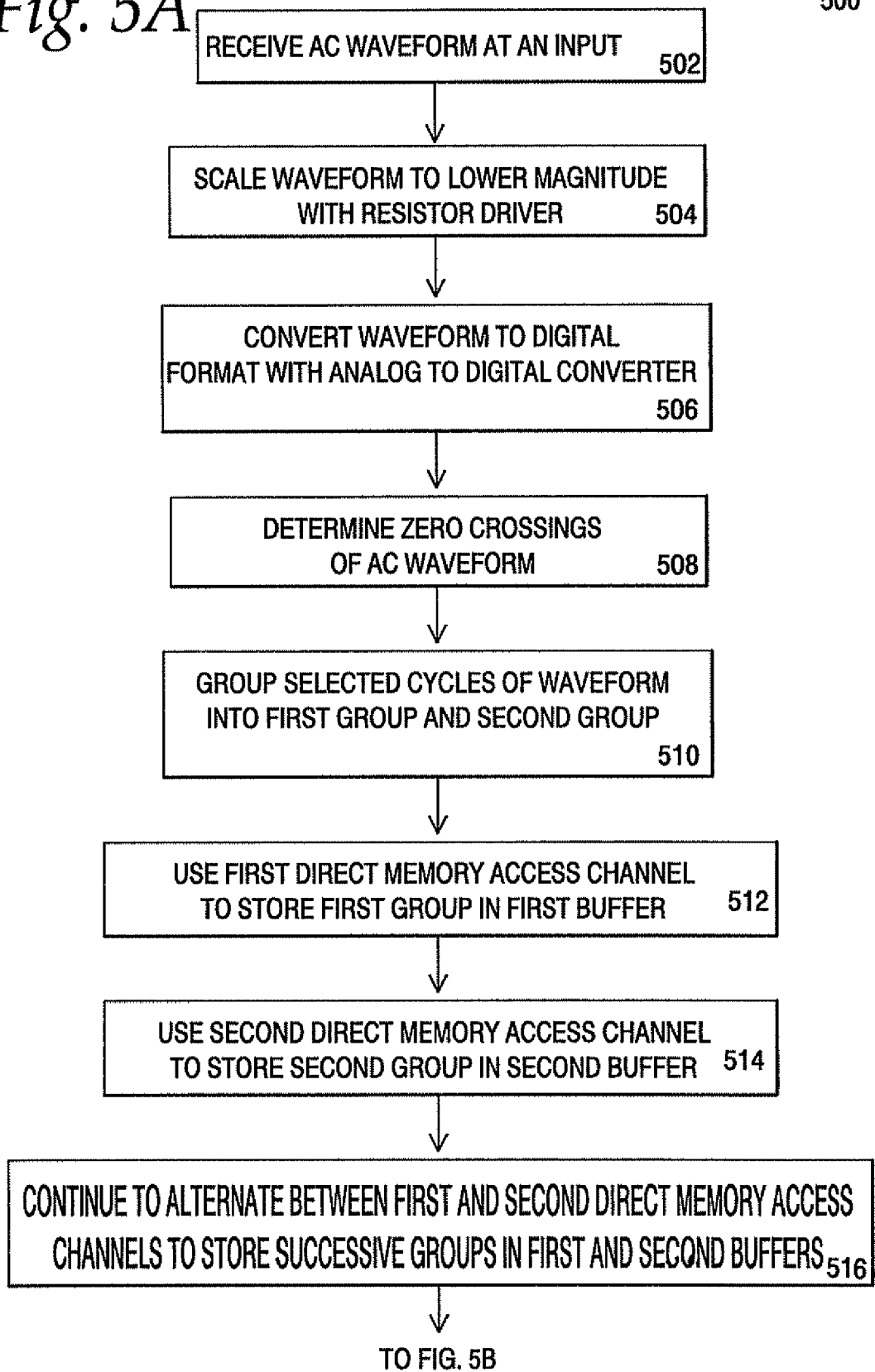

FIGS. 5A-5B together constitute a flow chart 500, which illustrates representative steps of methods utilized by the present invention for determining the frequency, RMS voltage and total harmonic distortion of the AC waveform. Exemplary steps of the methods may include receiving the waveform at the monitor in block 502, scaling the waveform to a lower magnitude such as with a resistor divider at block 504, converting the waveform into digital data representative of the waveform such as with an analog to digital converter at block 506, determining the zero crossing of successive cycles of the AC waveform at block 508, grouping a predetermined number of cycles of the AC waveform into a first group and into a second group at block 510, using a first direct memory access channel of a digital processor to store the digital representation of a first group of cycles in a first buffer at block 512, and using a second direct memory access channel of the digital processor to store the digital representation of a second group of cycles in a second buffer at block 514.

Further steps of the methods may include continuing to alternate use the first and second direct memory access channels to store successive cycles of the first group of cycles in successive memory locations of the first buffer until all cycles of the first group of cycles are stored in the first buffer as shown in block 516, processing the first group of cycles with the digital processor while the second group of cycles is being stored in the second buffer to determine the frequency of the AC waveform, the root mean square of the voltage of the AC waveform and/or the total harmonic distortion of the AC waveform as shown in block 518, processing the second group of cycles with the digital processor while the first group of cycles is being stored in the first buffer to determine the frequency of the AC waveform, the root mean square of the voltage of the AC waveform and/or the total harmonic distortion of the AC waveform as shown in block 520, and continuing to alternate use the first and second direct memory access channels to store successive cycles of the second group of cycles in successive memory locations of the second buffer until all cycles of the second group of cycles are stored in the second buffer as shown in block 522.

Still further steps of the methods may include processing the first and second groups of cycles with a fast Fourier transform (FFT) as shown at block 524, using zero detection and timer results to determine the frequency of waveform 140 as shown at block 526, using a fixed-point square root algorithm to determine the RMS voltage of the AC waveform 140 as shown at block 528, using the results of the FFT processing to determine the total harmonic distortion (THD) of the AC waveform as shown at block 530, and displaying the frequency, RMS voltage and/or the total harmonic distortion on display 21 of the voltage disturbance and harmonic monitor 20 as shown in block 532.

While particular embodiments of the invention have been shown and described, it will be obvious to those skilled in the art that changes and modifications may be made therein without departing from the invention in its broader aspects.

The invention claimed is:

1. In an electronic monitor for monitoring an AC power waveform, a method of processing information about the waveform to detect any impulses on the waveform, said method comprising the steps of:

receiving said waveform at the monitor;

scaling the waveform including any impulses to a lower magnitude;

rectifying any positive impulses on the waveform with a first operational amplifier having a diode in a feedback loop of the first operational amplifier;

rectifying any negative impulses on the waveform with a second operational amplifier having a diode in a feedback loop of the second operational amplifier; and converting the rectified positive and negative impulses to a digital form which is representative of the positive and negative impulses.

2. The method in accordance with claim 1 wherein the first and second operational amplifiers rectify the positive and negative impulses with approximately zero offset voltage.

3. The method in accordance with claim 1, said method further comprising the step of:

processing the digital representations of the positive and negative impulses to determine the occurrence of an impulse on the AC power waveform.

4. The method in accordance with claim 3, said method further comprising the step of:

displaying the occurrence of an impulse on the AC power waveform on a display of the monitor.

5. The method in accordance with claim 1, wherein the step of scaling the waveform including any impulses is accomplished with a resistor divider.

6. An electronic monitor for monitoring an AC power waveform to detect any impulses on the waveform, said electronic monitor comprising:
an input line for receiving said waveform at the monitor;
means for scaling the waveform including any impulses to a lower magnitude;
a first operational amplifier having a diode in a feedback loop of the first operational amplifier to rectify any positive impulses on the waveform;
a second operational amplifier having a diode in a feedback loop of the second operational amplifier to rectify any negative impulses on the waveform; and
an analog to digital converter to convert the rectified positive and negative impulses to a digital form which is representative of the positive and negative impulses.

7. The electronic monitor in accordance with claim 6 wherein the first and second operational amplifiers rectify the positive and negative impulses with approximately zero offset voltage.

8. The electronic monitor in accordance with claim 6, said electronic monitor further comprising:
a digital processor to process the digital representations of the positive and negative impulses to determine the occurrence of an impulse on the AC power waveform.

9. The electronic monitor in accordance with claim 8, said electronic monitor further comprising:
a display for displaying the occurrence of an impulse on the AC power waveform on a display of the monitor.

10. The electronic monitor in accordance with claim 6, wherein the means for scaling the waveform including any impulses is a resistor divider.

11. In an electronic monitor for monitoring an AC power waveform, said method comprising the steps of:
receiving said waveform at the monitor;
converting the waveform into digital data representative of the waveform;
determining the zero crossing of successive cycles of the AC waveform;
grouping a predetermined number of cycles of the AC waveform into a first group and a second group;
using a first direct memory access channel of a digital processor to store the digital representation of a first group of cycles in a first buffer; and
using a second direct memory access channel of the digital processor to store the digital representation of a second group of cycles in a second buffer.

12. The method in accordance with claim 11, said method further comprising the step of:
processing the first group of cycles with the digital processor while the second group of cycles is being stored in the second buffer.

13. The method in accordance with claim 12, wherein the processing of the first group of cycles determines the frequency of the AC waveform.

14. The method in accordance with claim 12, wherein the processing of the first group of cycles determines the root mean square of the voltage of the AC waveform.

15. The method in accordance with claim 12, wherein the processing of the first group of cycles determines the total harmonic distortion of the AC waveform.

16. The method in accordance with claim 12, wherein the first and second groups each constitute four cycles.

17. An electronic monitor for monitoring an AC power waveform, said electronic monitor comprising:
an input line for receiving said waveform at the monitor;
an analog to digital converter for converting the waveform into digital data representative of the waveform;
a zero crossing detector for determining the zero crossing of successive cycles of the AC waveform;
a digital processor for grouping a predetermined number of cycles of the AC waveform into a first group and a second group;
a first direct memory access channel of the digital processor for storing the digital representation of a first group of cycles in a first buffer; and
a second direct memory access channel of the digital processor for storing the digital representation of a second group of cycles in a second buffer.

18. The electronic monitor in accordance with claim 17, wherein said digital processor processes the first group of cycles with the digital processor while the second group of cycles is being stored in the second buffer.

19. The electronic monitor in accordance with claim 18, wherein the processing of the first group of cycles determines the frequency of the AC waveform.

20. The electronic monitor in accordance with claim 18, wherein the processing of the first group of cycles determines the root mean square of the voltage of the AC waveform.

21. The electronic monitor in accordance with claim 18, wherein the processing of the first group of cycles determines the total harmonic distortion of the AC waveform.

22. The electronic monitor in accordance with claim 17, wherein the first and second groups each constitute four cycles.

23. In an electronic monitor for monitoring an AC power waveform, said method comprising the steps of:
receiving said waveform at the monitor;
converting the waveform into digital data representative of the waveform;
determining the zero crossing of successive cycles of the AC waveform;
grouping a predetermined number of cycles of the AC waveform into a first group and a second group;
using a first direct memory access channel of a digital processor to store the digital representation of a first cycle of the first group of cycles in a first memory location in a first buffer; and
using a second direct memory access channel of the digital processor to store the digital representation of a second cycle of the first group of cycles in a second memory location of the first buffer.

24. The method in accordance with claim 23, said method further comprising the step of:
continuing to alternate use the first and second direct memory access channels to store successive cycles of the first group of cycles in successive memory locations of the first buffer until all cycles of the first group of cycles are stored in the first buffer.

25. The method in accordance with claim 24, said method further comprising the steps of:
using a first direct memory access channel of a digital processor to store the digital representation of a first cycle of the second group of cycles in a first memory location in a second buffer; and
using a second direct memory access channel of the digital processor to store the digital representation of a second cycle of the second group of cycles in a second memory location of the second buffer.

26. The method in accordance with claim 25, said method further comprising the step of:

continuing to alternate use the first and second direct memory access channels to store successive cycles of the second group of cycles in successive memory locations of the second buffer until all cycles of the second group of cycles are stored in the second buffer.

27. The method in accordance with claim 26, wherein the first and second groups each constitute four cycles.

* * * * *